(12) United States Patent
Gambino et al.

(10) Patent No.: US 7,781,321 B2
(45) Date of Patent: Aug. 24, 2010

(54) ELECTROLESS METAL DEPOSITION FOR DUAL WORK FUNCTION

(75) Inventors: Jeffrey P. Gambino, Westford, VT (US); Michael P. Chudzik, Dunbury, CT (US); Renee T. Mo, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 12/117,769

(22) Filed: May 9, 2008

(65) Prior Publication Data

US 2009/0280631 A1 Nov. 12, 2009

(51) Int. Cl.
*H01L 21/44* (2006.01)
(52) U.S. Cl. ............... 438/587; 438/670; 257/E21.174; 257/E21.623; 257/E21.637
(58) Field of Classification Search ................. 438/670, 438/588, 678; 257/E21.192, E21.202, E21.637, 257/E21.176, E21.177, E21.174, E21.623, 257/E21.195, E21.198, E21.206
See application file for complete search history.

(56) References Cited

U.S. PATENT DOCUMENTS

| 6,967,131 | B2 * | 11/2005 | Saenger et al. ............. 438/199 |
| 7,064,050 | B2 | 6/2006 | Cabral et al. |
| 7,071,086 | B2 | 7/2006 | Woo et al. |
| 7,112,851 | B2 | 9/2006 | Saenger et al. |
| 7,144,784 | B2 | 12/2006 | Min et al. |
| 7,157,378 | B2 | 1/2007 | Brask et al. |
| 7,160,767 | B2 | 1/2007 | Brask et al. |
| 7,183,649 | B1 | 2/2007 | Londergan et al. |
| 7,192,856 | B2 * | 3/2007 | Doczy et al. ............... 438/585 |
| 2002/0037615 | A1 * | 3/2002 | Matsuo ....................... 438/241 |
| 2003/0143837 | A1 * | 7/2003 | Gandikota et al. .......... 438/629 |
| 2006/0125108 | A1 | 6/2006 | Gutsche et al. |

* cited by examiner

*Primary Examiner*—Caridad M Everhart
(74) *Attorney, Agent, or Firm*—Scully, Scott, Murphy & Presser, P.C.; Richard M. Kotulak, Esq.

(57) ABSTRACT

The present invention, in one embodiment provides a method of forming a semiconducting device including providing a substrate including a semiconducting surface, the substrate comprising a first device region and a second device region; forming a high-k dielectric layer atop the semiconducting surface of the substrate; forming a block mask atop the second device region of the substrate, wherein the first device region of the substrate is exposed; forming a first metal layer atop the high-k dielectric layer present in the first device region of the substrate; removing the block mask to expose a portion of the high-k dielectric layer in the first device region of the substrate; forming a second metal layer atop the portion of the high-k dielectric layer in the second device region and atop the first metal in the first device region of the substrate; and forming gate structures in the first and second device regions of the substrate.

15 Claims, 5 Drawing Sheets

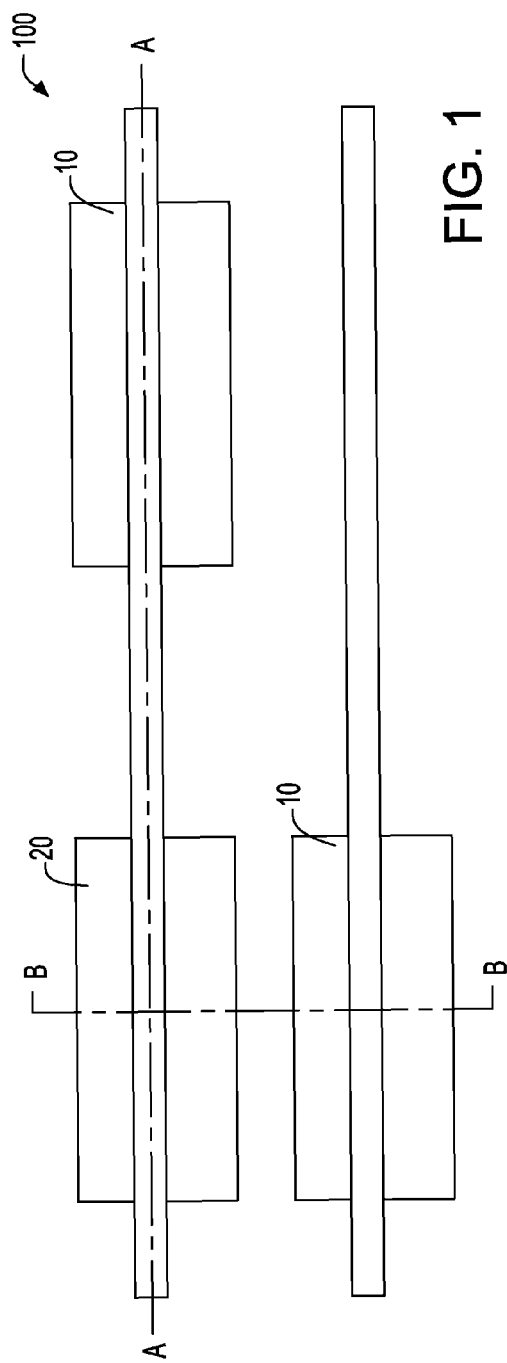
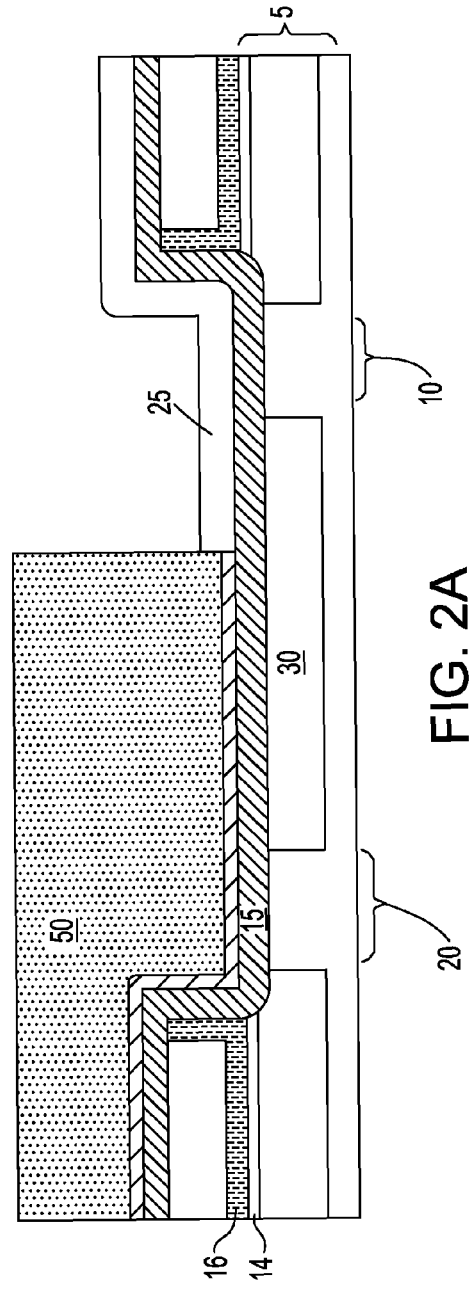

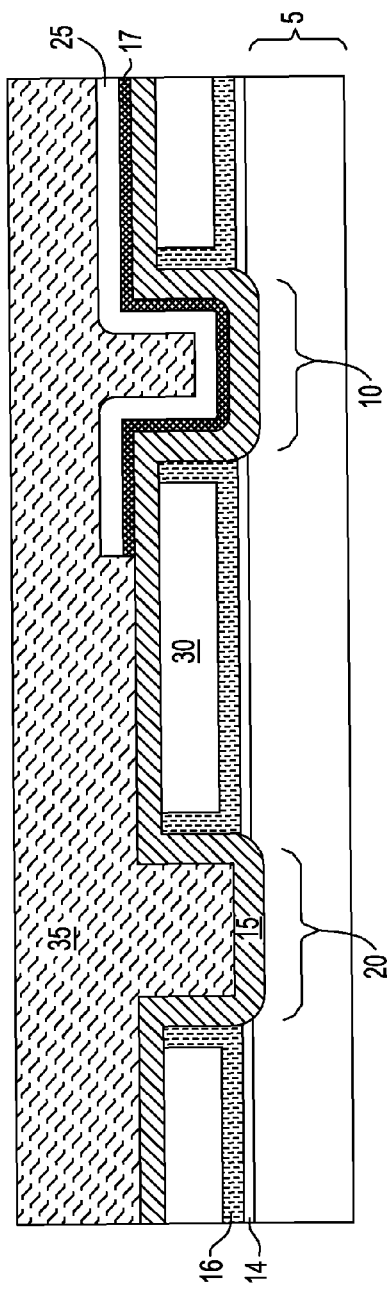
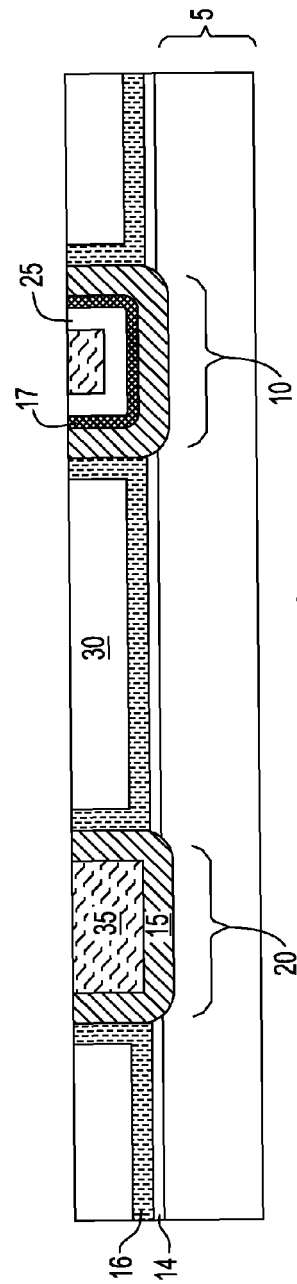
FIG. 5
FIG. 6

US 7,781,321 B2

ELECTROLESS METAL DEPOSITION FOR DUAL WORK FUNCTION

FIELD OF THE INVENTION

The present invention in one embodiment relates to microelectronics.

BACKGROUND OF THE INVENTION

Replacement gate processes are promising for the integration of high-dielectrics, such as $HfO_2$, $Al_2O_3$, $ArO_2$, and HfSiON, with metal gates, because the gate processing is typically done after high temperature anneals, i.e., after the source and drain process. Typically, dummy gate structures that include polysilicon gate structures and a gate dielectric that is typically composed of an oxide are replaced with metal gates and high-k gate dielectrics. Typically, the gate structures composed of the metal gate and the high-k gate dielectric are not subjected to high temperature anneals that degrade device performance by reducing the yield of the high-k gate dielectric and overall reliability of the device. However, the typical gate dielectric process is complicated by the requirement for different metals on nFETs and pFETs in order to provide a work function and threshold voltage that corresponds to the electrical requirements of the nFET or pFET device.

SUMMARY OF THE INVENTION

In one embodiment, the present invention provides a method of forming a semiconductor device in which the gate structures to the semiconductor device include a metal gate conductor having a composition that may be selected to provide the work function that is optimum for a p-type device, such as pFET, or an n-type device, such as an nFET. In one embodiment, the method of the present invention allows for the gate dielectric to be formed atop a p-type device and an n-type device using a single deposition step, wherein following formation at the gate dielectric, metal gate conductors of differing composition may be formed overlying the gate dielectric to the p-type and n-type devices. By providing gate structures as a single substrate having different metal compositions, the present invention provides a dual work function gate configuration.

Broadly, the method of forming a semiconductor device includes:

providing a substrate including a semiconducting surface, the substrate comprising a first device region and a second device region;

forming a high-k dielectric layer atop the semiconducting surface of the substrate;

forming a block mask atop the second device region of the substrate, wherein the first device region of the substrate is exposed;

forming a first metal layer atop the high-k dielectric layer present in the first device region of the substrate;

removing the block mask to expose a portion of the high-k dielectric layer in the first device region of the substrate;

forming a second metal layer atop the portion of the high-k dielectric layer in the second device region and atop the first metal in the first device region of the substrate; and forming gate structures in the first device region and the second device region of the substrate.

In one embodiment, the first device region includes at least one p-type semiconductor device, and the second device region includes at least one n-type semiconductor device. The high-k dielectric layer may include, but is not limited to, $HfO_2$, $ZrO_2$, $Al_2O_3$, $TiO_2$, $La_2O_3$, $SrTiO_3$, $LaAlO_3$, $Y_2O_3$, $SiO_2$, nitrided $SiO_2$ or silicates, nitrides or nitrided silicates thereof. A sacrificial capping layer may be formed atop the high-k dielectric layer.

The step of forming the block mask may include depositing a layer of photoresist atop the substrate, and patterning the layer of photoresist to protect the second device region and to expose the first device region. Prior to forming the block mask, in some embodiments of the present invention, the method further includes forming a silicon oxide capping layer over at least the second device region. In another embodiment, the capping layer may be formed of SiN, Ge, Al, W, TiN or a combination thereof.

The step of forming the first metal layer atop the high-k dielectric layer that is present in the first device region of the substrate may include depositing a layer of Pt, Pd, Ni, Co, Ru or a combination thereof. The forming of the first metal layer may include a deposition process that is conducted at a temperature that is less than the decomposition temperature of the block mask. In one embodiment, the step of forming of the first metal layer comprises an electroless deposition process. The electroless deposition process may include a deposition temperature ranging from about 15° C. to about 98° C.

Prior to forming the first metal layer, a seed layer may be formed atop the high-k gate dielectric layer, wherein the seed layer may enable a faster plating rate. The seed layer may be composed of Pd, Pt, Au, Rh, Ir or a combination thereof.

In one embodiment, the first metal layer is in direct physical contact with the second metal layer in the second device region. In another embodiment, the second metal layer is overlying the first metal layer in the second device regions, in which additional metal layers may be positioned therebetween, wherein the additional metal layer may be composed of a metal nitride.

The step of removing the block mask to expose the portion of the high-k dielectric layer in the first device region of the substrate can include an etch process including dilute HF.

The step of forming the second metal layer may include depositing a layer of TaN, TaC, Ti, Ta TiN, Zr, Hf or combinations thereof. In one embodiment, the step of forming the second metal layer includes an electroless deposition process. In one embodiment, the electroless deposition process includes a deposition temperature ranging from about 15° C. to about 98° C.

In one embodiment, the method further includes removing the seed layer from an interface of the high-k dielectric layer and the second metal layer.

In another embodiment, a first metal layer for a gate metal for the first device region is deposited overlying the first device region and the second device region of the substrate and then the first metal layer is removed from the second device region using an electroless deposition layer as a mask.

In another embodiment, the method of the present invention may include:

providing a substrate including a semiconducting surface, the substrate comprising a first device region and a second device region;

forming a high-k dielectric layer atop the semiconducting surface of the substrate;

forming a first metal layer atop the high-k dielectric layer atop the high-k dielectric layer;

removing a portion of first metal layer in the second device region to expose the high-k dielectric layer, wherein a remaining portion of the first metal layer is present in the first device region of the substrate;

forming a second metal layer atop the portion of the high-k dielectric layer in the second device region and overlying the remaining portion of first metal layer in the first device region of the substrate; and forming gate structures in the first and second device regions of the substrate.

The step of removing the portion of the first metal layer in the second device region to expose the high-k dielectric layer may include forming an electroless deposited mask atop the remaining portion of the first metal layer that is present in the first device region of the substrate. In a following process step, the exposed portion of the first metal layer in the second device region is removed by an etch process that is selective to the electroless deposited mask to expose the high-k dielectric layer in the second device region.

The step of forming the second metal layer atop the portion of the high-k dielectric layer in the second device region and overlying the remaining portion of the first metal layer in the first device region may include forming the second metal layer on the electroless deposited mask that is present on the remaining portion of the first metal layer.

DETAILED DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which:

FIG. 1 is a top planar view of a semiconducting device depicting section lines A-A and B-B, in which the cross-sections along section line A-A and B-B are used in the following Figures and description to describe some embodiments of the inventive method for forming a semiconducting device having a dual function metal gate on a high-k dielectric layer.

FIG. 2A is a side cross-sectional view along section line A-A of one embodiment of a method step for forming a dual work function metal gate, in which a block mask, such as a photoresist mask, and a low temperature deposition process is utilized to form a dual work function metal gate.

Figure 2B:
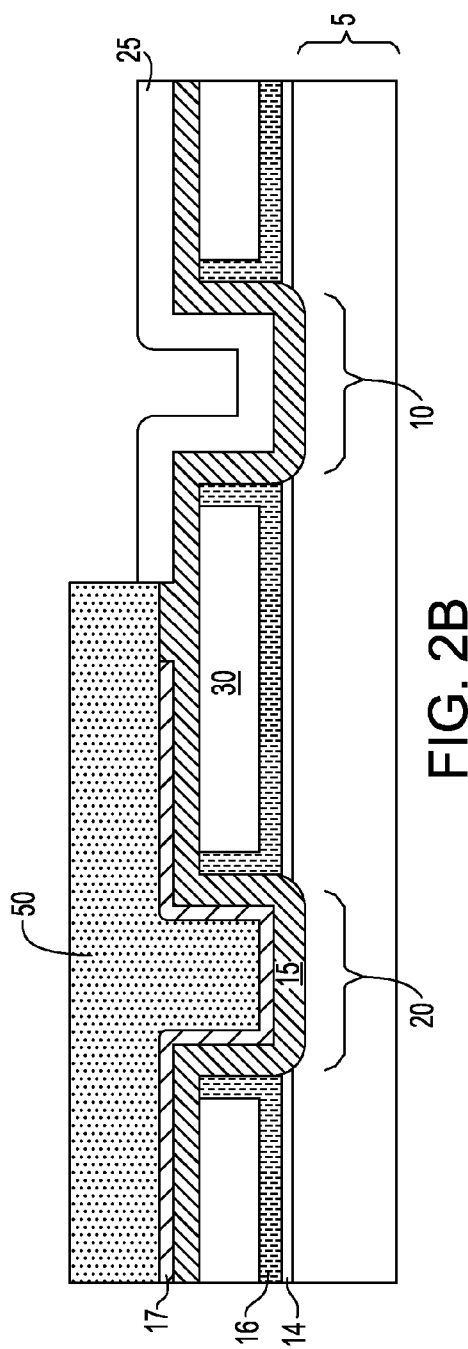
FIG. 2B is a side cross-sectional view along section line A-A of one embodiment of a method step for forming a dual work function metal gate, in which a block mask, such as a photoresist mask, and a low temperature deposition process is utilized to form a dual function metal gate.
Figure 3A:
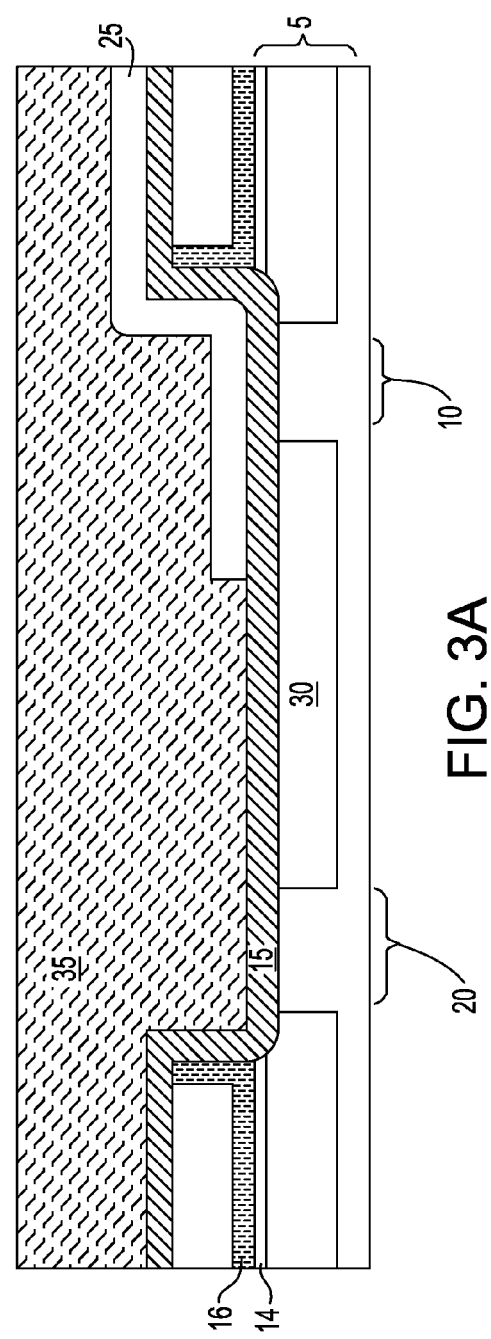

FIG. 3A is a side cross-sectional view along section line A-A of a method step for forming a dual work function metal gate, in which following deposition of the first metal layer using the block mask to select the portion of the high-k dielectric layer on which the first metal layer is deposited, the block mask is removed and a second metal layer is blanket deposited atop the structure depicted in FIG. 2A to provide a dual work function metal gate, in accordance with one embodiment of the present invention.

Figure 3B:
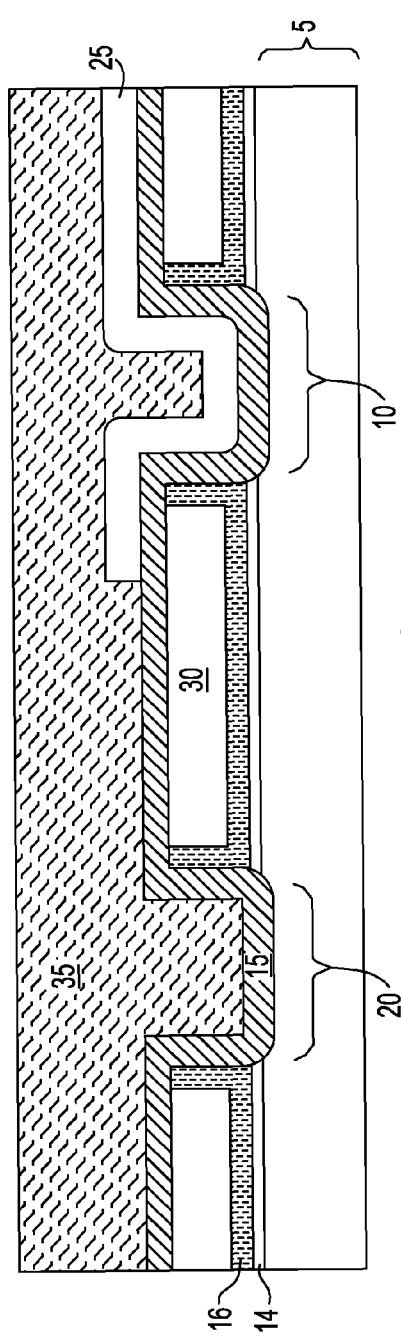

FIG. 3B is a side cross-sectional view along section line B-B of a method step for forming a dual work function metal gate, in which following deposition of the first metal layer using the block mask to select the portion of the high-k dielectric layer on which the first metal layer is deposited, the block mask is removed and a second metal layer is blanket deposited atop the structure depicted in FIG. 2B to provide a dual work function metal gate, in accordance with one embodiment of the present invention.

Figure 4:
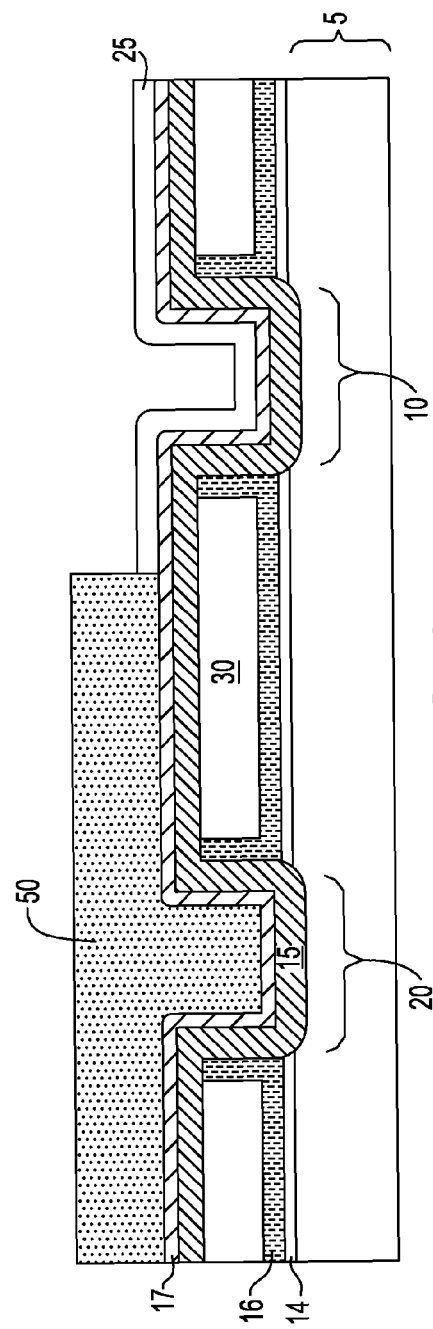

FIG. 4 is a side cross-sectional view along section line B-B of a method step for forming a dual work function metal gate in accordance with another embodiment of the present invention, in which a block mask, such as a photoresist mask, and a low temperature deposition process are utilized to form a first metal layer of a dual work function metal gate on a seed layer that is present on a high-k dielectric layer.

FIG. 5 is a side cross-sectional view along section line B-B of a method step for forming a dual work function metal gate, in which following deposition of the first metal layer the block mask is removed and a second metal layer is then deposited atop the first metal layer, in accordance with one embodiment of the present invention.

FIG. 6 is a side cross-sectional view along section line B-B of a method step for forming a dual work function metal gate, in which following the deposition of the second metal layer a planarization process is conducted, in accordance with one embodiment of the present invention.

Figure 7:
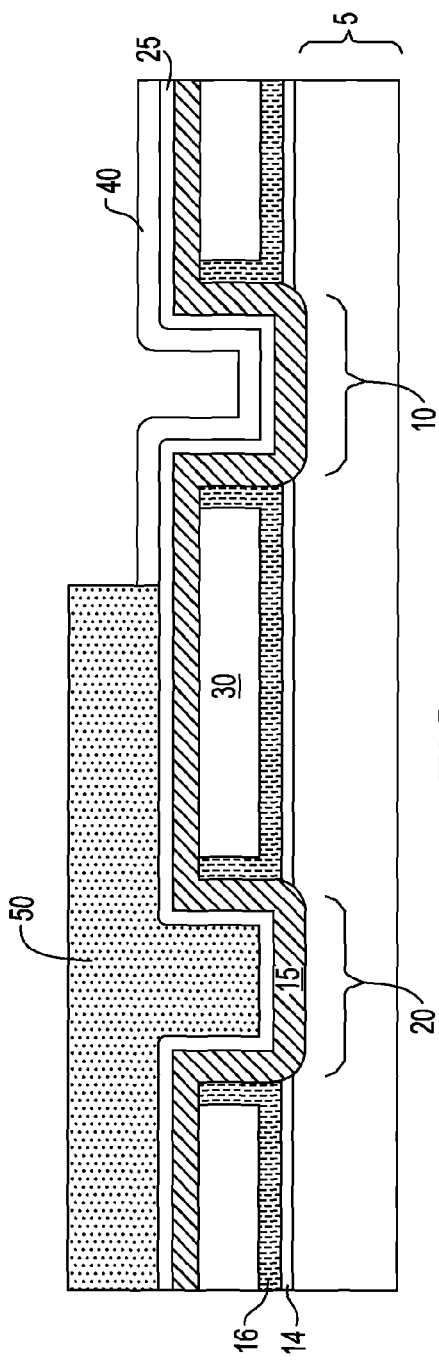

FIG. 7 is a side cross-sectional view along section line B-B of a method step for forming a dual work function metal gate, in which a first metal layer is deposited atop the first device region and the second device region of the substrate followed by the formation of an electroless deposited mask atop the first metal layer that is present in the first device region of the substrate, in accordance with one embodiment of the present invention.

Figure 8:
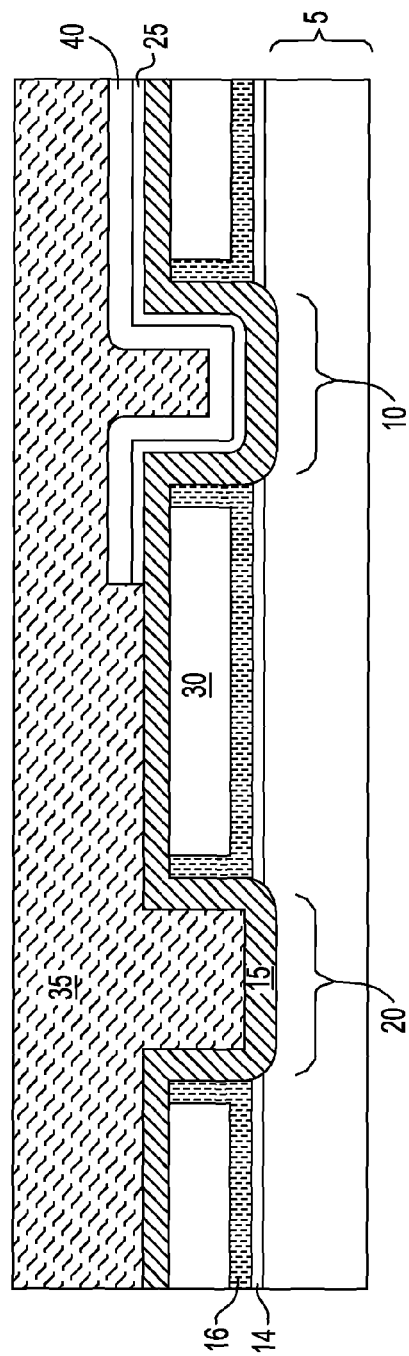

FIG. 8 is a side cross-sectional view along section line B-B of a method step for forming a dual work function metal gate, in which following the formation of the electroless deposited mask atop the first metal layer that is present in the first device region of the substrate, a second metal layer if formed overlying the first device region and the second device region of the substrate, in accordance with one embodiment of the present invention.

DETAILED DESCRIPTION OF THE PRESENT INVENTION

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

In one embodiment, the present invention relates to a method for forming a semiconducting device having a dual work function metal gate on a high-k dielectric layer, i.e., gate dielectric layer. When describing the following structures and methods, the following terms have the following meanings, unless otherwise indicated.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor classify it as either an n-type or p-type semiconductor. In intrinsic semiconductors the valence band and the conduction band are separated by the energy gap that may be as great as about 3.5 eV.

As used herein a "semiconducting surface" is a doped surface of the semiconductor device.

As used herein, a "P-type semiconductor" refers to the addition of trivalent impurities to an intrinsic semiconductor that create deficiencies of valence electrons, such as boron, aluminum or gallium to an intrinsic Si-containing substrate.

As used herein, an "N-type semiconductor" refers to the addition of pentavalent impurities that contribute free electrons to an intrinsic semiconductor, such as antimony, arsenic or phosphorous to an intrinsic Si-containing substrate.

As used herein, the terms "electroless deposition" describes a deposition process that utilizes oxidation-reduction reactions to deposit metals on an object without the passage of an electric current.

A "gate" means a structure used to control output current (i.e. flow of carriers in the channel) of a semiconducting device through electrical or magnetic fields.

As used herein, a "gate dielectric" is a layer of an insulator between the semiconductor device substrate and the gate conductor.

As used herein, "high K" denotes a dielectric material featuring dielectric constant (k) higher than about 4.0.

As used herein, a "metal" is an electrically conductive material, wherein in metal atoms are held together by the force of a metallic bond; and the energy band structure of metal's conduction and valence bands overlap, and hence, there is no energy gap.

As used herein, the terms "insulating" and "dielectric" denote a material having a room temperature conductivity of less than about $10\text{-}10\ (\Omega\text{-m})^{-1}$.

As used herein, "a conformal layer" is a deposited material having a thickness that remains the same regardless of the geometry of underlying features on which the layer is deposited, wherein the thickness of the layer does not deviate from greater than or less than 20% of an average value for the thickness of the layer.

The terms "overlying", "atop", "positioned on" or "positioned atop" means that a first element, such as a first structure, e.g. a first layer, is present on a second element, such as a second structure, e.g. a second layer, wherein intervening elements, such as an interface structure, e.g. interface layer, may be present between the first element and the second element.

The term "direct physical contact" means that a first element and a second elements that are in contact without any intermediary conducting, insulating or semiconducting layers at the interface of the two elements.

FIG. 1 depicts one embodiment of a semiconducting device 100 having a dual work function metal on a high-k gate dielectric layer (interchangeably referred to as a high-k gate dielectric) that may be formed in accordance with the present invention, in which section lines A-A is along a section line parallel to the length of the device channel and section line B-B is along a section line perpendicular to the length of the device channel. Each section line extends through a first device region 10 and a second device region 20. In one embodiment, the first device region 10 includes at least one n-type semiconducting device, such as an nFET, and the second device region 20 includes at least one p-type semiconducting device, such as a pFET. The first device region 10 and the second device region 20 may be separated by isolation regions.

FIGS. 2A-3B depict one embodiment of a method for forming a semiconducting device 100 having a dual work function gate, in accordance with the present invention. The method may begin with providing a substrate 5 including a semiconducting surface, and having a first device region 10 and a second device region 20. In a following step, a high-k dielectric layer 15 is formed atop the semiconducting surface of the substrate 5. Thereafter, a block mask 50 is formed atop the second device region 20 of the substrate 5, wherein the first device region 10 of the substrate 5 is exposed. In a following process step, a first metal layer 25 is formed atop the high-k dielectric layer 15 that is present in the first device region 10 of the substrate 5. The block mask 50 is then removed to expose a portion of the high-k dielectric layer 15 in the first device region 10 of the substrate 5. In a following sequence, a second metal layer 35 is formed atop the portion of the high-k gate dielectric 15 in the second device region 20 and atop the first metal layer 25 in the first device region 10 of the substrate 5; and gate structures are formed in the first and second device regions 10, 20 of the substrate 5.

FIGS. 2A and 2B depict a method step in which a block mask 50, such as a photoresist mask, and a low temperature deposition process are utilized to form a first metal layer 25 atop a high-k gate dielectric layer 15 that is present overlying an initial structure including a substrate 5 having a first device region 10 and a second device region 20, in accordance with one embodiment of the present invention.

The initial structure depicted in FIGS. 2A and 2B may be formed using a replacement gate process. The following description of the replacement gate process is provided for illustrate purposes only, wherein the present invention is not to be limited thereto, as other process steps and sequences have been contemplated and are within the scope of the present invention.

The substrate 5 may include, but is not limited to: Si-containing materials, GaAs, InAs and other like semiconductors. The term "Si-containing layer" denotes any material that includes silicon. Si-containing materials as used to provide the substrate 5 include, but are not limited to: Si, bulk Si, single crystal Si, polycrystalline Si, SiGe, amorphous Si, silicon-on-insulator substrates (SOI), SiGe-on-insulator (SGOI), strained-silicon-on-insulator, and annealed poly Si. In one embodiment in which the substrate 5 is a silicon-on-insulator (SOI) or SiGe-on-insulator (SGOI) substrate, the thickness of the Si-containing layer atop the buried insulating layer can have a thickness on the order of 10 nm or greater. In one embodiment, the SOI or SGOI substrate may be fabricated using a thermal bonding process, or in another embodiment may be fabricated by an ion implantation process. The substrate 5 may be n-type or p-type depending on the type of device to be fabricated. The substrate 5 may optional include various active regions. In one embodiment, the first device region 10 is subsequently processed to provide at least one n-type semiconductor device, and the second device region 20 includes at least one p-type semiconductor device.

In one embodiment, after providing the substrate 5, a first pad dielectric layer 14 composed of an oxide material is typically formed on an upper exposed surface of the SOI substrate 10 by a thermal oxidation process. In another embodiment, the first pad dielectric layer 14 may be formed by a deposition process, such as chemical vapor deposition (CVD), plasma-assisted chemical vapor deposition, evaporation or solution deposition. The first pad dielectric layer 14 formed at this point of the present invention typically has a thickness ranging from about 5 nm to about 20 nm. In one embodiment, the first pad dielectric layer 14 is composed of silicon oxide. It is noted that other embodiments have been contemplated in which the first pad dielectric layer 14 is a nitride or an oxynitride.

Next, isolation trench regions (not shown), such as shallow trench isolation (STI) regions, may be formed into the substrate 5. In one example, the STI regions are formed by etching a trench in the semiconducting substrate 5 utilizing a conventional dry etching process, such as reactive-ion etching (RIE) or plasma etching. The trenches may optionally be lined with a conventional liner material, e.g., an oxide, and then CVD or another like deposition process is used to fill the trench with polysilicon or another like STI dielectric material. The STI dielectric may optionally be densified after deposition. A conventional planarization process such as chemical-mechanical polishing (CMP) may optionally be used to provide a planar structure.

In a following process step, a dummy gate (not shown) including a sacrificial polysilicon region or other related material is then formed on a portion of the first pad dielectric layer 14 in the first device region 10 and the second device region 20. The dummy gate may be formed by first providing a sacrificial polysilicon layer or other related material atop the first pad dielectric layer 14 utilizing a deposition process, such as CVD or PECVD. Chemical vapor deposition (CVD) is a deposition process in which a deposited species is formed as a result of chemical reactions between gaseous reactants at greater than room temperature (25° C. to 600° C.); wherein solid product of the reaction is deposited on the surface on which a film, coating, or layer of the solid product is to be formed. Variations of CVD processes include, but are not limited to: Atmospheric Pressure CVD (APCVD), Low Pressure CVD (LPCVD), Plasma Enhanced CVD (EPCVD), Metal-Organic CVD (MOCVD) and combinations thereof.

The sacrificial polysilicon layer is then patterned by lithography and etching. In another embodiment, the dummy gate may be formed atop a sacrificial gate dielectric that is formed atop the surface of the first device region 10 and the second device region 20. Next, source and drain extension regions (not shown), deep source and drain regions (not shown), and/or halo regions (not shown) are formed into the substrate 5 utilizing an implantation process. N-type semiconductor devices are produced within Si-containing substrates by doping the substrate 5 to provide source and drain region extensions and deep source and drain regions with group III-A elements. P-type semiconductor devices are produced within Si-containing substrates by doping the substrate 5 to provide source and drain region extensions and deep source and drain regions with group V elements.

Still referring to FIGS. 2A and 2B, in a following process step, a second pad dielectric layer 16 is formed on each sidewall of the dummy gate and the surface of the substrate 5 between adjacent dummy gates. The second pad dielectric layer 16 may be composed of a nitride, oxynitride or a combination thereof. In one embodiment, the second pad dielectric layer 16 is composed of silicon nitride. In one embodiment, the second pad dielectric layer 16 is deposited using chemical vapor deposition. In another embodiment, the second pad dielectric layer 16 is deposited using a conformal deposition process. In one embodiment, the second pad dielectric layer 16 has a thickness ranging from about 10 nm to about 100 nm. In another embodiment, the second pad dielectric layer 16 has a thickness ranging from about 20 nm to about 40 nm.

In a following process, a planarizing material 30, such as a high-density plasma (HDP) oxide or an oxide from tetraethylorthosilicate (TEOS), is deposited and planarized such that an upper surface of the planarizing material 30 is coplanar with an upper surface of the dummy gate. The planarization process may include chemical mechanical planarization (CMP).

Next, the dummy gate, i.e., sacrificial polysilicon region of the dummy gate, is removed from the structure stopping atop the first pad dielectric layer 14. The sacrificial polysilicon regions may be removed using a selective etch process, which removes the sacrificial polysilicon regions selective to the material of the first pad dielectric layer 14. As used herein, the term "selective" in reference to a material removal process denotes that the rate of material removal for a first material is greater than the rate of removal for at least another material of the structure to which the material removal process is being applied.

In one embodiment, following the removal of the dummy gate, i.e., sacrificial polysilicon layer, the exposed portion of the first pad dielectric layer 14 is removed to expose a portion of the surface of the semiconducting substrate 5 in the first device region 10 and the second device region 20, while the portion of the first pad dielectric layer 14 that is underlying the second pad dielectric layer 16 and the planarization material 30 remains. The portion of the first pad dielectric layer 14 that is exposed by removing the dummy gate may be removed by a selective etch process that removes the material of the first pad dielectric layer 14 selective to the semiconducting substrate 5, the second pad dielectric layer 16 and the planarization material 30.

Still referring to FIGS. 2A and 2B, and in a following process step, a high-k dielectric layer 15 is formed atop the exposed semiconducting surface of the substrate 5. In one embodiment, the high-k dielectric layer 15 is formed in direct physical contact with the portion of the semiconducting surface in the first device region 10 and the second device region 20 that is exposed by the removal of the dummy gate. In one embodiment, the high-k dielectric layer 15 is a continuous layer that extends from the exposed semiconducting surface of the first device region to the exposed semiconducting surface of the second device region, wherein the portion of the high-k dielectric layer 15 that is present between the exposed semiconducting surface of the first device region 10 and the exposed semiconducting surface of the second device region 20 is positioned overlying a portion of the planarizing material 30 and a portion of the second pad dielectric layer 16. The high-k dielectric layer 15 may be interchangeably referred to as a high-k gate dielectric.

The high-k dielectric layer 15 may be formed by a deposition process, such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes. In one embodiment, the high-k dielectric layer 15 is formed by a conformal deposition process. In another embodiment, the high-k dielectric layer 15 is formed by a thermal growth process such as, for example, oxidation, nitridation or oxynitridation. It is noted that the high-k dielectric layer 15 may also be formed utilizing any combination of the above processes.

The high-k dielectric layer 15 is comprised of an insulating material having a dielectric constant of about 4.0 or greater. In another embodiment, the high-k dielectric layer 15 is comprised of an insulating material having a dielectric constant greater than 7.0. The dielectric constants mentioned herein are relative to a vacuum. Note that $SiO_2$ typically has a dielectric constant that is about 4.0. In another embodiment, the high-k dielectric layer 15 is composed of $TiO_2$, $Al_2O_3$, $ZrO_2$, $HfO_2$, $Ta_2O_5$, $La_2O_3$, $SrTiO_3$, $LaAlO_3$, $Y_2O_3$ and mixture thereof. In one embodiment, the high-k dielectric layer 15 is composed of a hafnium containing composition. Examples of hafnium containing compositions include but are not limited to $HfO_2$, hafnium silicate and hafnium silicon oxynitride. In another embodiment, the physical thickness of the high-k dielectric layer 15 may vary, but typically, the gate dielectric has a thickness from about 1 nm to about 10 nm. In another embodiment, the high-k dielectric layer 15 has a thickness from about 1 nm to about 3 nm.

In one embodiment, a sacrificial capping layer 17 is formed atop the high-k dielectric layer 15. In one embodiment, the sacrificial capping layer 17 is an oxide containing material, such as silicon oxide. In one embodiment, sacrificial capping layer 17 is formed using a thermal growth process, such as thermal oxidation, or is formed using a deposition process, such as chemical vapor deposition (CVD). In another embodiment, the sacrificial capping layer 17 may be composed of SiN, Ge, Al, W, TiN or a combination thereof.

In one embodiment of the present invention, and in a following process step, a block mask 50 is formed atop the second device region 20 of the substrate 5, wherein the first device region 10 of the substrate 5 is exposed. The block mask 50 may be composed of a photoresist material. In one embodiment, a layer of photoresist material is applied atop the first device region 10 and the second device region 20 of the substrate 5 via spin coating or similar processes. In one embodiment, the photoresist material comprises of dielectrics including carbon, oxygen, and inorganic materials. Following application of the photoresist layer, the photoresist is soft-baked, where the solvents of the photoresist layer are evaporated via heating.

The layer of photoresist is then patterned using photolithography. A patterned photoresist block mask 50 is formed utilizing photolithography and development steps. Specifically, in one embodiment, a pattern is formed using a reticle or photomask and transferred into the surface of the layer of the photoresist that is present on overlying the substrate 5. First, the pattern on the reticle or photomask is transferred onto a layer of photoresist on the surface to be etched, or alternatively implanted. Light is passed through the opaque pattern of the reticle, which in turn produces a patterned image on the layer of photoresist. The photoresist layer is a light or radiation sensitive material and exposure to light causes changes in the photoresist structure source. For example, exposure to light may change the exposed portions of the photoresist from a soluble condition to an insoluble one.

Following exposure the pattern is developed utilizing a conventional resist developer, such as a chemical solvent. The developer leaves a hole in the resist layer that corresponds to the opaque pattern of the reticle. An alternative resist strategy, commonly referred to as a negative resist, leaves a pattern in the resist opposite to that on the mask. Development of the pattern is conducted using conventional development techniques including, but not limited to: continuous spray development and puddle development. Following development, the remaining portion of the photoresist layer is present overlying the second device region 20, wherein the first device region 10 is exposed.

Still referring to FIGS. 2A and 2B, and in one embodiment of the invention, following the formation of the block mask 50, a first metal layer 25 is formed atop the high-k dielectric layer 15 that is present in the first device region 10 of the substrate 5. In one embodiment, the block mask 50 that is present over the second device region 20 obstructs the first metal layer 25 from being deposited on the high-k dielectric layer 15 that is present in the second device region 20.

The step of forming the first metal layer 25 atop the high-k dielectric layer 15 that is present in the first device region 10 of the substrate 5 may include depositing a layer of Pt, Pd, Ni, Co, Ru or a combination thereof. In one embodiment, in which the first device region 10 contains p-type semiconductor device, such as nFETs, the first metal layer 25 is composed of Ru, Pd, Pt, Co, Ni and conductive metal oxides, such as Ru oxide. In one embodiment, the first metal layer 25 has a thickness ranging from about 1 nm to about 200 nm. In another embodiment, the first metal layer 25 has a thickness ranging from about 10 nm to about 20 nm.

The method of forming the first metal layer 25 may include a deposition process that is conducted at a temperature that is less than the decomposition temperature of the photoresist block mask 50. When the photoresist block mask 50 is composed of photoresist materials, such as polyimide, the decomposition temperature ranges from about 200° C. to about 400° C.

In one embodiment, the step of forming of the first metal layer 25 includes an electroless deposition process, which may interchangeably be referred to as electroless plating. Electroless plating uses simultaneous oxidation-reduction reactions to deposit metals on an object without the passage of an electric current. In one embodiment of electroless deposition, a redox reaction involving the oxidation of one or more soluble reducing agent(s) and the reduction of one or more metallic ions occurs. In one embodiment, the object to be plated is immersed in a plating path that contains suitable reducing agents as well as a source of metal ions.

In one embodiment, Ni plating is provided using electroless deposition with a Ni source composed of nickel sulfate hexahydrate ($NiSO_4.6H_2O$) and a reducing agent composed of sodium hypophosphate ($NaH_2PO_4.H_2O$). In one embodiment, Pd plating is provided using electroless deposition with a Pd source composed of palladium chloride ($PdCl_2$) and a reducing agent composed of sodium hypophosphite ($NaH_2PO_4.H_2O$). In one embodiment, Pt plating is provided with a Pt source composed of platinum nitrate salt ($Pt(NH_3)_2.(NO)_2$) and a reducing agent composed of hydrazine ($N_2H_4.H_2O$). Other suitable reducing agents include, but are not limited to: sodium borohydride ($NaBH_4$), formaldehyde (HCHO), dimethyl-aminoborane (($CH_3)_2NH.BH_3$), hydrazine ($N_2H_4$) or a combination thereof. In one embodiment, the electroless deposition process includes a deposition temperature ranging from about 15° C. to about 98° C. In another embodiment, the electroless deposition process includes a deposition temperature ranging from about 80° C. to about 90° C.

For many metals, such as Co, Cu, Pd, Pt and combinations thereof, the surface of the deposited metal produced by the electroless deposition process is sufficiently catalytic for the process to continue. To begin electroless deposition, however, the high-k dielectric layer 15 may, in some instances, be first seeded with a thin layer of catalytic material, hereafter referred to as a seed layer 17, such as palladium or platinum to initiate the electroless deposition. In one embodiment, the seed layer 17 enables a faster plating rate to be obtained for some metals, such as cobalt. Typical, the seed layer 17 may be composed of Pd, Pt, Au, Rh, Ir or a combination thereof. More commonly, the surface is primed with a palladium ion containing solution. Palladium ion undergoes an immersion exchange reaction with the high-k dielectric layer 15 leading to formation of a thin layer (1 to a few mono layer thick) of palladium.

FIGS. 4-6 depict a method step for forming a dual work function metal gate in which a photoresist mask 50 and an electroless deposition process is utilized to form a first metal layer 25 on a seed layer 17. FIG. 4 depicts one embodiment of a method step for forming a dual work function metal gate in which a photoresist mask 50 and an electroless deposition process is utilized to form a first metal layer 25 on a seed layer 17, wherein the seed layer 17 is present on a high-k dielectric layer 15 that is present in the first device region 25 of the substrate 5.

Referring to FIG. 2A, 2B and FIG. 4, following the deposition of the first metal layer 25, the block mask 50 is removed from the first device region 10 to expose a portion of the high-k dielectric layer 15 in the first device region 10 of the substrate 5. The block mask 50 may be removed by an etch process including dilute HF. In another embodiment, the block mask 50 is removed using an oxygen ashing process.

FIGS. 3A and 3B depict one embodiment of forming a second metal layer 35 atop the portion of the high-k dielectric layer 15 in the second device region 20 and atop the first metal layer 25 in the first device region 10 of the substrate 5. FIG. 5 depicts forming a second metal layer 35 atop the portion of the high-k gate dielectric layer 15 in the second device region 20 and atop the first metal layer 25 in the first device region 10 of the substrate 5, in which the first metal layer 25 is in direct physical contact with a seed layer 17 that is present on a high-k dielectric layer 15 in the first device region 10 of the substrate 5.

In one embodiment, the second metal layer 35 is deposited at a temperature that is less than the decomposition temperature of the photoresist material that provides the block mask 50.

Similar to the method of depositing the first metal layer 25, the second metal layer 35 may be deposited using an electroless deposition process. In one embodiment, the thickness of the second metal layer 35 ranges from about 10 nm to about 500 nm. In another embodiment, the thickness of the second metal layer 35 ranges from about 50 nm to about 100 nm. In one embodiment, in which the second device region 20 includes an nFET device, the second metal layer 35 may be composed of Hf, Zr, Ti, Ta, Al and their carbides, such as hafnium carbide, zirconium carbide and combinations thereof.

In one embodiment, following the formation of the second metal layer 35, gate structures are formed in the first and second device regions 10, 20 of the substrate 5 by planarizing the upper surface of the structure depicted in FIGS. 3A, 3B and 4. In one embodiment, the planarization process continues until stopping of the upper surface of the planarization material 30. As used herein, planarization is a material removal process that employs at least mechanical forces, such as frictional media, to produce a planar surface. In one embodiment, the planarization process includes chemical mechanical planarization. Chemical Mechanical Planarization (CMP) is a material removal process using both chemical reactions and mechanical forces to remove material and planarize a surface. FIG. 6 depicts one embodiment of a structure following planarization applied to the second metal layer 35 stopping on the planarization material 30, in which a seed layer 17 is present between the first metal layer 25 and the high-k dielectric layer 15 that is present in the first device region 10 of the substrate 5. In one embodiment, the second metal layer 35 and the first metal layer 25 are planarized until the connecting portion of the first metal layer 35 between the first device region 10 and the second device region 20 is removed, and the planarization material 30 provides for isolation between adjacent gate structures.

FIG. 6 is a side cross-sectional view along section line B-B of a method step for forming a dual function metal gate, in which following the deposition of the second metal layer 35 a planarization process is conducted, in accordance with one embodiment of the present invention. It is noted that although FIG. 6 depicts the embodiments of the present invention in which the seed layer 17 is present between the first metal layer 25 and the high-k dielectric layer 15, the depiction of the gate structures that is provided in FIG. 6 is equally applicable to the embodiments of the present invention, in which the seed layer 17 is not present, such as the embodiments of the present invention that are depicted in FIGS. 2A-3B.

FIGS. 7 and 8 depict a method for forming a dual function metal gate, in which a first metal layer 25 is deposited atop the first device region 10 and the second device region 20 of the substrate 10 followed by the formation of an electroless deposited mask 40 atop the first metal layer 25 that is present in the first device region 10 of the substrate 5, in accordance with the present invention. In one embodiment, the method includes the steps of providing a substrate 5 including a semiconducting surface, the substrate 5 including a first device region 10 and a second device region 20; forming a high-k dielectric layer 15 atop the semiconducting surface of the substrate 5; forming a first metal layer 25 atop the high-k dielectric layer 15; removing a portion of first metal layer 15 in the second device region 20 to expose the high-k dielectric layer 15, wherein a remaining portion of the first metal layer 25 is present in the first device region 10 of the substrate 5; forming a second metal layer 35 atop the portion of the high-k dielectric layer 15 in the second device region 20 and overlying the remaining portion of first metal layer 15 in the first device region 10 of the substrate 5; and forming gate structures in the first device region 10 and second device region 20 of the substrate 5.

Referring to FIG. 7, the description of the high-k dielectric layer 15, as described above with reference to FIGS. 1-6, is equally applicable to the embodiments of the present invention that correspond to FIGS. 7 and 8. In one embodiment, the high-k dielectric layer 15 may be composed of hafnium silicon oxynitride (HfSiON).

The first metal layer 25 may be deposited using chemical vapor deposition (CVD) or physical vapor deposition (PVD). Examples of PVD that are suitable for depositing the first metal layer 25 include, but are not limited to sputtering and plating. Variations of CVD processes include, but are not limited to: Atomic Layer Deposition (ALD), Atmospheric Pressure CVD (APCVD), Low Pressure CVD (LPCVD), Plasma Enhanced CVD (EPCVD), Metal-Organic CVD (MOCVD) and combinations thereof. In one embodiment, the first metal layer 25 is deposited to a thickness ranging from about 1 nm to about 200 nm. In another embodiment, the first metal layer 25 is deposited to a thickness ranging from about 10 nm to about 20 nm. In one embodiment, in which the first device region is to be composed of nFET devices, the first metal layer 25 may be composed of TaN, TaC, TiC, Ti, Ta, TiN, Zr, Hf or combinations thereof.

In one embodiment, following the deposition of the first metal layer 25 on the first device region 10 and the second device region 20 of the substrate 5, a block mask 50, which may be composed of photoresist material, is formed overlying the second device region 20, wherein a portion of the first metal layer 25 is left exposed. It is noted that the above description of the block mask 50 described with reference to the embodiments of the present invention that correspond to FIGS. 1-6, is equally applicable to the embodiments of the present invention that correspond to FIGS. 7-8.

In one embodiment, following the block mask 50, an electroless deposited etch mask 40 is formed overlying the first device region 10. In one embodiment, when the first device region 10 is composed of an nFET device, the electroless deposited etch mask 40 is composed of Pt, Pd, Ni, Co, Ru or a combination thereof.

Following formation of the electroless deposited etch mask 40, the block mask 50 is removed to expose the portion of the first metal layer 35 that is present in the second device region 20. In one embodiment, the block mask 50 is removed by an etch process including dilute HF. In another embodiment, the block mask 50 is removed using an oxygen ashing process.

In a following processing step, the exposed portion of the first metal layer 25 is removed using an etch process to expose the portion of the high-k dielectric layer 15 that is present overlying the second device region 20. In one embodiment, the etch process is a selective etch that removes the first metal layer 25 selective to the electroless deposited etch mask 40. In one embodiment, in which the first metal layer 25 is composed of TiN and the electroless deposited etch mask 40 is composed of Pt, the etch process includes a wet etch having an etch chemistry composed of $H_2SO_4:H_2O_2$ or $NH_4OH:H_2O_2:H_2O$.

Referring to FIG. 8, and in one embodiment, following removal of the first metal layer 25 from the second device region 20 of the substrate 5, a second metal layer 35 is formed overlying the first device region 10 and the second device region 20 of the substrate 5. In one embodiment, when the second device region 20 is composed of p-type devices, such as a pFET, the second metal layer 35 may be composed of Ru, Pd, Pt, Co, Ni and conductive metal oxides such as Ru oxide.

In one embodiment, the second metal layer 35 is deposited using an electroless deposition process. Similar to the embodiments described above with reference to FIGS. 1-6. In one embodiment, the electroless deposition process includes a deposition temperature that is less than the temperature of the decomposition temperature of the photoresist material of the block mask 50.

In one embodiment, following the formation of the second metal layer 35, gate structures are formed in the first and second device regions 10, 20 of the substrate 5 by planarizing the upper surface of the structure depicted in FIG. 8. In one embodiment, the planarization process continues until stopping of the upper surface of the planarization material 30.

Following the formation of the gate structures a conventional back end of the line process flow may be applied. In one embodiment, a layer of dielectric material is blanket deposited atop the entire substrate and planarized source. The blanket dielectric may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, a-C:H). Some additional choices for the blanket dielectric include: any of the aforementioned materials in porous form, or in a form that changes during processing to or from being porous and/or permeable to being non-porous and/or non-permeable.

The blanket dielectric may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The deposited dielectric is then patterned and etched to forth via holes to the various source/drain and gate structures of the substrate. Following via formation interconnects are formed by depositing a conductive metal into the via holes using conventional processing, such as CVD or plating. The conductive metal may include, but is not limited to: tungsten, copper, aluminum, silver, gold, and alloys thereof.

While the present invention has been particularly shown and described with respect to the preferred embodiments thereof, it will be understood by those skilled in the art that the foregoing and other changes in forms of details may be made without departing form the spirit and scope of the present invention. It is therefore intended that the present invention not be limited to the exact forms and details described and illustrated, but fall within the scope of the appended claims.

What is claimed:

1. A method of forming a semiconducting device comprising:
    providing a substrate including a semiconducting surface, the substrate comprising a first device region and a second device region;
    forming a high-k dielectric layer atop the semiconducting surface of the substrate;
    forming a photoresist block mask atop the second device region of the substrate, wherein the first device region of the substrate is exposed;
    forming a first metal layer using an electroless deposition process having a deposition temperature ranging from about 15° C. to 98° C. atop the high-k dielectric layer present in the first device region of the substrate;
    removing the photoresist block mask to expose a portion of the high-k dielectric layer in the first device region of the substrate;
    forming a second metal layer using the electroless deposition process having the deposition temperature ranging from about 15° C. to 98° C. in direct contact with an entirety of the portion of the high-k dielectric layer in the second device region and in direct contact with an entirety of a portion of the first metal in the first device region of the substrate; and
    forming gate structures in the first device and the second device region of the substrate, wherein conductive components including the first metal layer and the second metal layer are formed only by the electroless deposition process.

2. The method of claim 1, wherein the high-k dielectric layer comprises $HfO_2$, $ZrO_2$, $Al_2O_3$, $TiO_2$, $La_2O_3$, $SrTiO_3$, $LaAlO_3$, $Y_2O_3$, $SiO_2$, nitrided $SiO_2$ or silicates, nitrides or nitrided silicates thereof.

3. The method of claim 1, wherein the high-k dielectric layer has a dielectric constant greater than about 4.0.

4. The method of claim 1, wherein forming the photoresist block mask comprises depositing a layer of photoresist atop the substrate, and patterning the layer of photoresist to protect the second device region and expose the first device region.

5. The method of claim 1, wherein the removing of the photoresist block mask to expose the portion of the high-k gate dielectric layer in the first device region of the substrate comprises an etch process comprising dilute HF.

6. The method of claim 1, wherein the first device region comprises at least one p-type semiconductor device, and the second device region comprises at least one n-type semiconductor device.

7. The method of claim 6, wherein the forming of the first metal layer atop the high-k dielectric layer present in the first device region of the substrate comprises depositing a layer of Pt, Pd, Ni, Co, Ru or combinations thereof.

8. The method of claim 6, wherein the forming of the second metal layer comprises depositing a layer of TaN, TaC, Ti, Ta TiN, Zr, Hf or combinations thereof.

9. The method of claim 6, wherein the first metal layer is in direct physical contact with the second metal layer in the second device region.

10. The method of claim 6, wherein prior to forming the photoresist block mask, the method further comprises forming a capping layer over at least the second device region.

11. The method of claim 10, wherein prior to forming the first metal layer a seed layer is formed atop the high-k gate dielectric layer.

12. The method of claim 1, further comprising depositing a seed layer atop the high-k gate dielectric layer.

13. The method of claim 12, further comprising annealing to remove the seed layer from an interface of the high-k gate dielectric and the second metal layer.

14. A method of forming a semiconducting device comprising:

providing a substrate including a semiconducting surface, the substrate comprising a first device region and a second device region;

forming a high-k dielectric layer atop the semiconducting surface of the substrate;

forming a first metal layer atop the high-k dielectric layer atop the high-k gate dielectric;

removing a portion of first metal layer in the second device region to expose the high-k dielectric layer, in which the removing of the portion of the first metal layer comprises forming an electroless deposited mask atop a remaining portion of the first metal layer and removing the portion of the first metal layer using an etch process that is selective to the electroless deposited mask to expose the high-k dielectric layer in the second device region, wherein the remaining portion of the first metal layer is present in the first device region of the substrate;

forming a second metal layer atop the portion of the high-k gate dielectric in the second device region and overlying the remaining portion of first metal layer in the first device region of the substrate; and forming gate structures in the first device region and second device region of the substrate.

15. The method of claim 14, wherein the step of forming the second metal layer atop the portion of the high-k gate dielectric in the second device region and overlying the remaining portion of the first metal layer in the first device region includes forming the second metal layer on the electroless deposited mask that is present on the remaining portion of the first metal layer.

* * * * *